(12) United States Patent
Vityaev et al.

(10) Patent No.: US 8,069,397 B2
(45) Date of Patent: Nov. 29, 2011

(54) USE OF ECC WITH ITERATIVE DECODING FOR ITERATIVE AND NON-ITERATIVE DECODING IN A READ CHANNEL FOR A DISK DRIVE

(75) Inventors: Andrei E. Vityaev, San Jose, CA (US); Thomas V. Souvignier, Longmont, CO (US); Gregory L. Silvus, Boulder, CO (US)

(73) Assignee: Broadcom Corporation, Irvine, CA (US)

( * ) Notice: Subject to any disclaimer, the term of this patent is extended or adjusted under 35 U.S.C. 154(b) by 1186 days.

(21) Appl. No.: 11/643,067

(22) Filed: Dec. 21, 2006

(65) Prior Publication Data

US 2008/0022189 A1  Jan. 24, 2008

Related U.S. Application Data

(60) Provisional application No. 60/819,686, filed on Jul. 10, 2006.

(51) Int. Cl.
*H03M 13/00* (2006.01)
(52) U.S. Cl. .................................. 714/774; 714/755
(58) Field of Classification Search .................. 714/774, 714/755
See application file for complete search history.

(56) References Cited

U.S. PATENT DOCUMENTS

| | | | | |
|---|---|---|---|---|
| 5,970,085 | A * | 10/1999 | Yi | 370/342 |
| 6,094,427 | A * | 7/2000 | Yi | 370/331 |
| 6,304,996 | B1 * | 10/2001 | Van Stralen et al. | 714/796 |
| 6,732,327 | B1 * | 5/2004 | Heinila | 714/792 |
| 7,000,168 | B2 * | 2/2006 | Kurtas et al. | 714/755 |
| 7,096,402 | B2 * | 8/2006 | Yano et al. | 714/755 |
| 7,222,286 | B2 * | 5/2007 | Kim | 714/784 |
| 7,340,664 | B2 * | 3/2008 | Shen | 714/755 |
| 7,373,585 | B2 * | 5/2008 | Yedidia et al. | 714/786 |
| 7,395,495 | B2 * | 7/2008 | Jacobsen | 714/804 |
| 7,502,982 | B2 * | 3/2009 | Silvus et al. | 714/753 |
| 7,689,888 | B2 * | 3/2010 | Kan et al. | 714/758 |
| 7,814,398 | B2 * | 10/2010 | Djurdjevic et al. | 714/784 |
| 2002/0116681 | A1 * | 8/2002 | Amrani et al. | 714/792 |
| 2002/0188906 | A1 * | 12/2002 | Kurtas et al. | 714/755 |
| 2003/0084398 | A1 * | 5/2003 | Nguyen | 714/786 |
| 2005/0018793 | A1 * | 1/2005 | Learned | 375/340 |
| 2005/0022101 | A1 * | 1/2005 | Malm et al. | 714/801 |
| 2005/0066261 | A1 * | 3/2005 | Morita et al. | 714/800 |
| 2005/0154957 | A1 * | 7/2005 | Jacobsen | 714/752 |
| 2006/0156171 | A1 * | 7/2006 | Kuznetsov et al. | 714/755 |
| 2006/0161830 | A1 * | 7/2006 | Yedidia et al. | 714/758 |

(Continued)

OTHER PUBLICATIONS

"Algebraic Soft-Decision Decoding of Reed-Solomon Codes"; Koetter & Vardy; IEEE Transactions on Information Theory, vol. 49, No. 11, Nov. 2003; pp. 2809-2825.

(Continued)

*Primary Examiner* — M. Mujtaba K Chaudry
(74) *Attorney, Agent, or Firm* — Garlick Harrison & Markison (57) ABSTRACT

A scheme in which a first decoder provides first decoding of a signal read from a disk. A second decoder, coupled to an output of the first decoder, combines with the first decoder to provide iterative decoding to recover data stored on the disk when in an iterative mode of operation. However, when in a non-iterative mode of operation, the output of the first decoder is coupled to an error correction code module to apply error correction code (ECC) to the output of the first decoder to recover data stored on the disk by non-iterative decoding.

20 Claims, 5 Drawing Sheets

U.S. PATENT DOCUMENTS

| | | | | |
|---|---|---|---|---|
| 2006/0192691 | A1* | 8/2006 | Kan et al. | 341/50 |
| 2006/0265634 | A1* | 11/2006 | Silvus et al. | 714/784 |
| 2007/0288833 | A1* | 12/2007 | Djurdjevic et al. | 714/784 |
| 2009/0249163 | A1* | 10/2009 | Ovchinnikov et al. | 714/755 |

OTHER PUBLICATIONS

"A Viterbi Algorithm with Soft-Decision Outputs and its Applications"; Hagenauer & Hoeher; IEEE publication CH2682-3/89/0000-1680; 1989; pp. 1680-1686.

"Optimal Decoding of Linear Codes for Minimizing Symbol Error Rate"; Bahl et al.; IEEE Transactions on Information Theory, Mar. 1974; pp. 284-287.

"Optimal Code Rates for the Lorentzian Channel: Shannon Codes and LDPC Codes"; Ryan et al.; IEEE Transactions on Magnetics, vol. 40. No. 6, Nov. 2004; pp. 3559-3565.

* cited by examiner

FIG. 5 ures and advantages of the present invention will become# USE OF ECC WITH ITERATIVE DECODING FOR ITERATIVE AND NON-ITERATIVE DECODING IN A READ CHANNEL FOR A DISK DRIVE

CROSS REFERENCE TO RELATED APPLICATION

This application claims the benefit of priority to U.S. Provisional Patent Application Ser. No. 60/819,686; filed Jul. 10, 2006; and titled "Use of ECC with iterative decoding for iterative and non-iterative decoding in a read channel for a disk drive," which is incorporated herein by reference.

BACKGROUND OF THE INVENTION

1. Technical Field of the Invention

The embodiments of the invention relate generally to disk drives and, more particularly, to a use of ECC in combination with iterative decoding.

2. Description of Related Art

Varieties of memory storage devices, such as magnetic disk drives, are available to store data and are used to provide data storage for a host device, either directly, or through a network. Those networks may be a storage area network (SAN) or a network attached storage (NAS). Typical host devices include stand alone computer systems such as a desktop or laptop computer, enterprise storage devices such as servers, storage arrays such as a redundant array of independent disk (RAID) arrays, storage routers, storage switches and storage directors, and other consumer devices such as video game systems and digital video recorders. These devices generally provide high storage capacity in a cost effective manner. Disk drives, including hard disk drives (HDDs), comprise one category of such storage devices.

With some of the HDDs, there may be performance issues associated when performing timing recovery of a signal that is read from the disk. That is, appropriate digital sampling is performed for accurate and effective recovery of the information from signals read from the disk. If improper or inadequate digital sampling is performed on the signal that is read from the disk, then some of the data recovered may be inaccurate or not recovered at all.

In order to continually improve the data read capabilities of HDDs, various sampling techniques may be implemented or enhanced to read, sample and recover the stored data. However, one limiting factor with HDDs is the standard that is implemented with the disk operating system in setting a particular sector size for HDDs. For example, personal computers operating on Microsoft Corporation's current operating system software partition HDDs into 512 byte sectors. Thus, 512 byte sector size is a standard that is used with computers utilizing this operating system.

In the future, operating system software may partition the HDD to have larger sector sizes. For example, one upgraded operating system may partitioned the disk into 4096 (4K) byte sector size. In this instance, there is an eight-fold increase in the sector size. In response, corresponding changes in circuitry and sampling techniques will most likely be needed to accommodate the larger sector size. It is appreciated that until the larger sector size (for example, the 4K byte sector size) becomes prevalent, computer systems may still operate with HDDs that have currently existing sector size, such as the 512 byte sector size. The term used to describe current and past implementation is generally referred to as "legacy."

Accordingly, for an interim time period, manufacturers of HDDs may be required to provide HDDs that operate at 512 byte sector size HDDs, as well as 4K byte sector size HDDs. However, certain circuitry allowing for an acceptable bit error rate (BER) for 512 byte sectors may not provide acceptable BER at the larger sector size, since parameters that affect the BER at one sector size may have significantly different characteristics at a second sector size. Therefore, HDD devices or controllers that control a hard disk may be required to provide separate circuitry to handle each of the sector sizes being implemented or alternatively, provide HDDs or controllers that is operable with one selected sector size.

For manufacturers of integrated circuits (ICs) that operate as controllers to control a HDD, two choices are available to decode the sampled data at two different sector sizes. One is to manufacture separate ICs for each of the sector sizes to handle the differences in decoding. However, this results in two separate IC designs, one for each type of IC. The disadvantage of this approach is that the legacy design (e.g. 512 byte sectors) is operable only with the legacy HDD (e.g. HDDs capable of 512 byte sectors only). Thus, if a legacy HDD controller is present in a computer system operating with the legacy operating system, when the computer system is upgraded to the new operating system capable of using the larger sector size, the HDD may need to be replaced.

A second choice is to include separate circuitry for each different sector size in the one IC, and allow the HDD to migrate to the large sector size. This allows one IC design to operate with both sector sizes, so that the controller IC chip and/or the HDD, need not be made obsolete when migrating to the new operating system (or other software) that uses the larger sector size.

SUMMARY OF THE INVENTION

The present invention is directed to apparatus and methods of operation that are further described in the following Brief Description of the Drawings, the Detailed Description of the Embodiments of the Invention, and the Claims. Other features and advantages of the present invention will become apparent from the following detailed description of the embodiments of the invention made with reference to the accompanying drawings.

DETAILED DESCRIPTION OF THE EMBODIMENTS OF THE INVENTION

The embodiments of the present invention may be practiced in a variety of settings that implement a hard disk drive (HDD) or other memory storage device that utilize a controller to sample and decode data read from the disk. The HDD may be stand alone, implemented within another device or integrated in a device or product.

Figure 1:
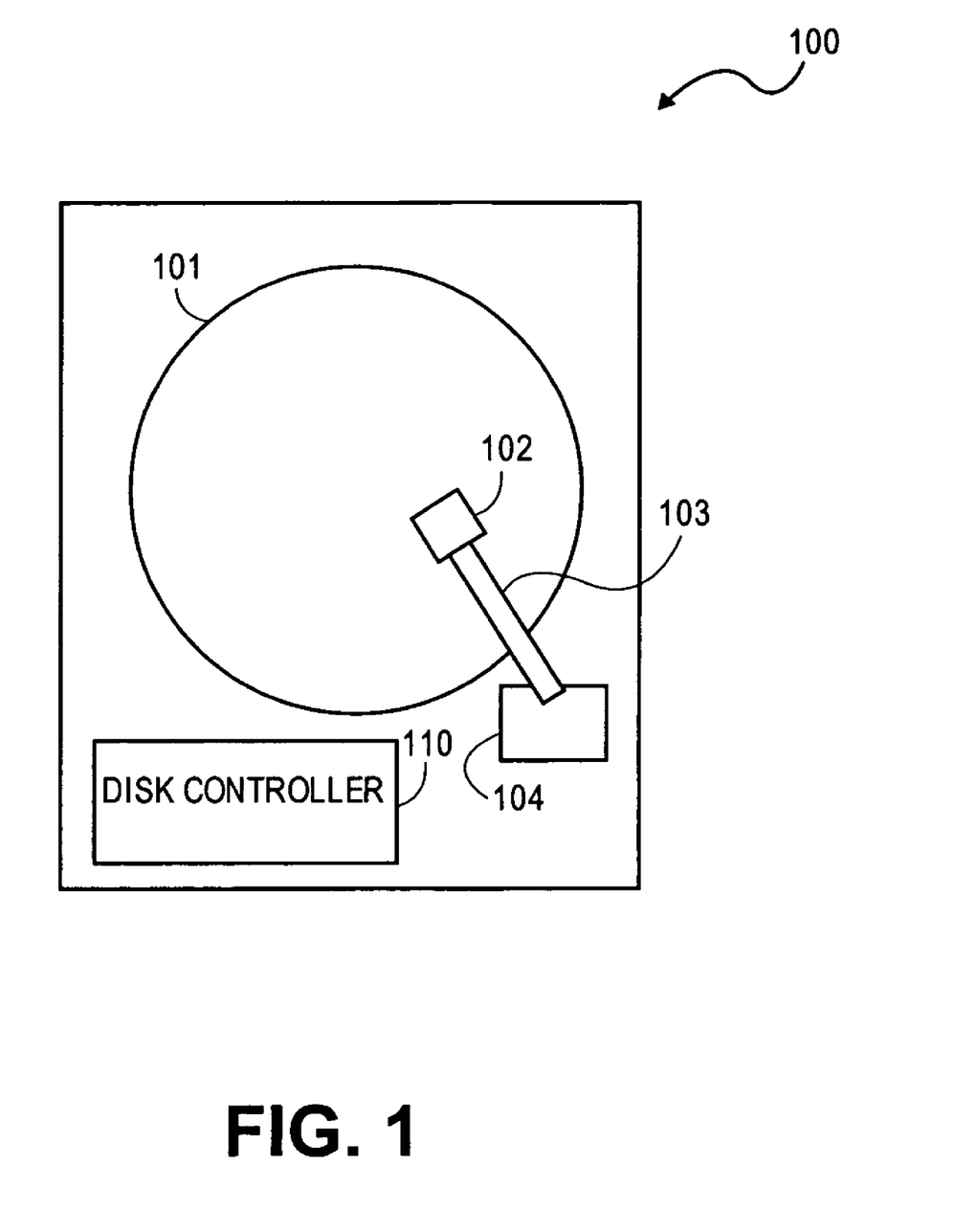
FIG. 1 shows an embodiment of a disk drive device for practicing the invention.

FIG. 1 illustrates an example embodiment of a disk drive 100 for practicing one embodiment of the invention. In particular, disk drive 100 is a HDD device that includes a disk 101 to store data. Disk 101 is typically rotated by a servo or motor (not shown) at a specified velocity depending on a particular application for its use. Disk 101 may be constructed from various materials and in one embodiment, disk 101 is a magnetic disk that stores information as magnetic field changes on some type of magnetic medium. The medium may be rigid or non-rigid, although HDD devices generally have rigid disks. Disk 101 may be removable or non-removable. Disk 101 typically is made of magnetic material or coated with magnetic material. It is to be noted that in other embodiments, disk 101 may employ other data storage technology, such as an optical medium, and need not be limited to magnetic storage.

Disk drive 100 typically includes one or more read/write heads 102 that are coupled to an arm 103 that is moved by an actuator 104 over the surface of the disk 101 either by translation, rotation or both. Disk drive 100 may have one disk 101, or multiple disks with multiple read/write heads 102. Disk drive 100 includes a disk controller module 110 that is utilized for controlling the operation of the disk drive, including read and write operations to disk 101, as well as controlling the speed of the servo motor and the motion of actuator 108. Disk controller module 110 may also include an interface to couple to an external device, such as a host device. It is to be noted that disk drive 100 is but one example and other disk drives may be readily implemented to practice various embodiments of the invention.

Disk drive 100, or any other equivalent disk drive, may be implemented in a variety of devices. For example, disk drive 100 may be implemented in a handheld audio unit. In one such embodiment, disk drive 100 may include a small form factor magnetic hard disk that has a diameter of approximately 1.8" or smaller and incorporated into or otherwise used by handheld audio unit to provide general storage, including storage of audio content.

In another example embodiment, disk drive 100 may be implemented in a computer. In one such embodiment, disk drive 100 may include a small form factor magnetic disk that may be used in a variety of applications, including enterprise storage applications. Disk drive 100 is incorporated into or otherwise used by a computer to provide general purpose storage and the computer may be attached to a storage array, such as a redundant array of independent disks (RAID) array, storage router, edge router, storage switch and/or storage director. Disk drive 100 may be implemented in a variety of computers (or computing devices), such as desktop computers and notebook computers.

In another example embodiment, disk drive unit 100 may be implemented in a wireless communication device to provide general storage. In one such embodiment, the wireless communication device may communicate via a wireless telephone network such as a cellular, personal communications service (PCS), general packet radio service (GPRS), global system for mobile communications (GSM), integrated digital enhanced network (iDEN) or other wireless communications network capable of sending and receiving telephone calls. Furthermore, the wireless communication device may communicate via the Internet to access email, download content, access websites, and provide streaming audio and/or video programming. In this fashion, the wireless communication device may place and receive telephone calls, text messages, short message service (SMS) messages, pages and other data messages that may include attachments such as documents, audio files, video files, images and other graphics.

Still as another example, disk drive 100 may be implemented in the personal digital assistant (PDA). In one such embodiment, disk drive 100 may include a small form factor magnetic hard disk to provide general data storage.

In these various embodiments for disk drive 100, a variety of data, as well as program instructions, may be stored. Stored data may include, and is not limited to, general data, data for motion picture expert group (MPEG) audio layer 3 (MP3) files or Windows Media Architecture (WMA) files, video content such as MPEG4 files, JPEG (Joint Photographic Expert Group) files, bitmap files and files stored in other graphics formats, emails, webpage information and other information downloaded from the Internet, address book information, and/or any other type of information that may be stored on a disk medium.

Figure 2:
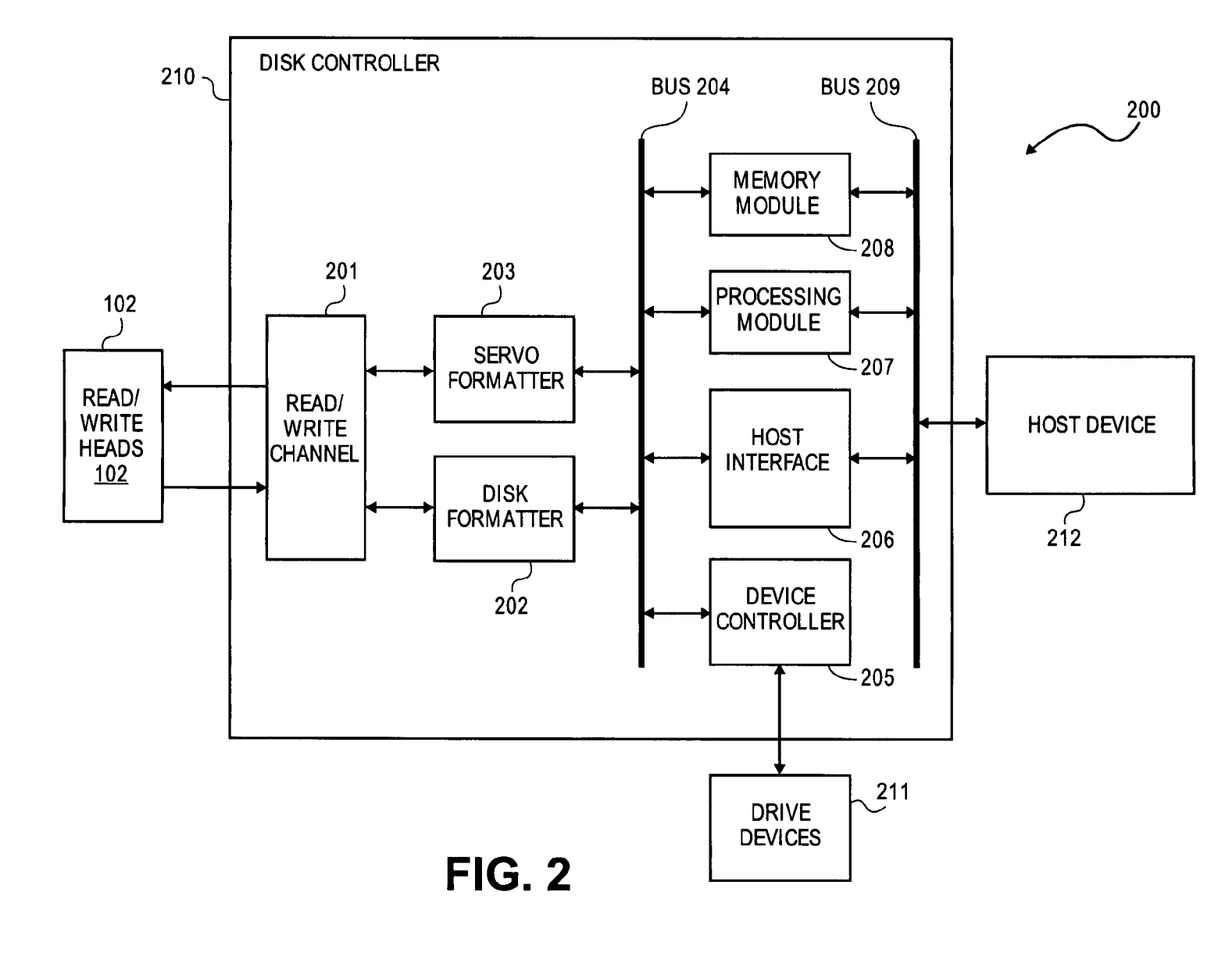
FIG. 2 shows one embodiment of an apparatus that includes a disk controller.

FIG. 2 illustrates an embodiment of an apparatus 200 that may be implemented with disk drive 100 of FIG. 1. Read/write head 102 is shown coupled to a disk controller 210, which may be used for disk controller 110 of FIG. 1. In the particular embodiment, disk controller 210 includes a read/write channel 201 coupled to head 102 for reading and writing data to and from disk 101. A disk formatter 202 is included for controlling the formatting of data and provides clock signals and other timing signals that control the flow of the data written to, and data read from disk 101 through read/write channel 201. A servo formatter 203, also coupled to read/write channel 201, provides clock signals and other control and timing signals based on servo control data read from disk 101. Disk formatter 202 and servo formatter 203 are also coupled to bus 204. Disk controller 210 further includes a device controller 205, host interface 206, processing module 207 and memory module 208, as well as a second bus 209. Device controller 205 controls the operation of a drive device(s) 211. Device(s) 211 may be devices such as actuator 108 and the servo (or spindle) motor used to rotate disk 101. Host interface 206 is coupled to a host device 212 to receive commands from host device 212 and/or transfer data between host 212 and disk 101 in accordance with a particular protocol.

Processing module 207 may be implemented using one or more microprocessors, micro-controllers, digital signal processors, microcomputers, central processing units, field programmable gate arrays, programmable logic devices, state machines, logic circuits, analog circuits, digital circuits, and/or any devices that manipulates signal (analog and/or digital) based on operational instructions. The operational instructions may reside in memory module 208 or may reside elsewhere. When processing module 207 is implemented with two or more devices, each device may perform the same steps, processes or functions in order to provide fault tolerance or redundancy. Alternatively, the function, steps and processes performed by processing module 207 may be split between different devices to provide greater computational speed and/or efficiency.

Memory module 208 may be a single memory device or a plurality of memory devices. Such a memory device may be a read-only memory (ROM), random access memory (RAM), volatile memory, non-volatile memory, static random access memory (SRAM), dynamic random access memory (DRAM), flash memory, cache memory, and/or any device that stores digital information. It is to be noted that when processing module 207 implements one or more of its functions via a state machine, analog circuitry, digital circuitry, and/or logic circuitry, memory module 208 storing the corresponding operational instructions may be embedded within, or reside external to, the circuitry comprising the state machine, analog circuitry, digital circuitry, and/or logic circuitry. Furthermore, memory module 208 stores, and the processing module 207 executes, operational instructions that may correspond to one or more of the steps or a process, method and/or function illustrated herein.

Each of these elements of controller 210 may be implemented in hardware, firmware, software or a combination thereof, in accordance with the broad scope of the present invention. While a particular bus architecture is shown in FIG. 2 with buses 204, 209, alternative bus architectures that include either a single bus configuration or additional buses are likewise possible to be implemented as different embodiments.

In one embodiment, one or more modules of disk controller 210 are implemented as part of a system on a chip (SoC) integrated circuit. In the particular embodiment shown, disk controller 210 is part of a SoC integrated circuit that may include other circuits, devices, modules, units, etc., which provide various functions such as protocol conversion, code encoding and decoding, power supply, etc. In other embodiments, the various functions and features of disk controller 210 may be implemented in a plurality of integrated circuits that communicate and combine to perform the functionality of disk controller 210.

When the drive unit 100 is manufactured, disk formatter 203 generally writes a plurality of servo wedges along with a corresponding plurality of servo address marks at equal radial distance along the disk 101. The servo address marks are used by the timing generator for triggering a "start time" for various events employed when accessing the media of the disk 101.

Figure 3:
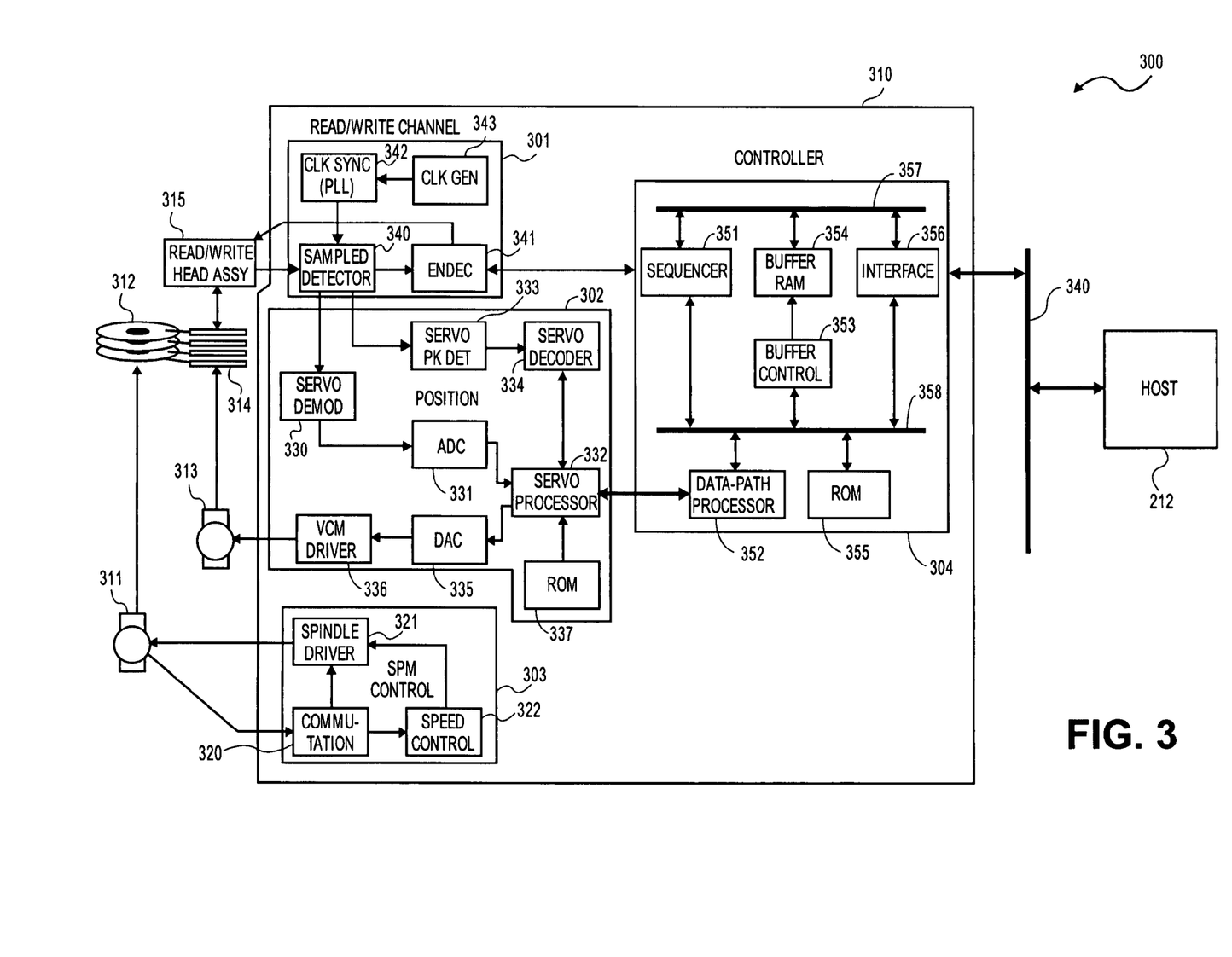
FIG. 3 shows another embodiment of an apparatus that includes a disk controller.

FIG. 3 illustrates another embodiment of an apparatus 300 that may be implemented with disk drive 100 of FIG. 1. Apparatus 300 includes a disk controller 310, which may be used for disk controller 110 of FIG. 1. In this particular embodiment, disk controller 310 includes a read/write channel module 301, position module 302, spindle motor (SPM) control module 303 and controller module 304. As shown, disk controller 310 is integrated on an integrated circuit chip and in some embodiments, disk controller 310 may also be implemented as a SoC. Alternatively, as noted above, disk controller 310 may be implemented in multiple chips, or even as discreet components.

Apparatus 300 of FIG. 3 is shown having a spindle servo or motor 311, which turns one or more disks 312. In the illustration, multiple disks 312 are shown. However, the disk drive may only have one disk in other embodiments. Hereinafter, the description refers to disks 312, but it is understood that there may only be one disk present. The disks 312 may be rigid or non-rigid, but in typical HDD units, the disks 312 are rigid media for storing data.

Apparatus 300 also includes an actuator servo (or motor) 313 to move read/write head or heads 314. Read/write heads 314 are part of a read/write head assembly 315 which read data from disks 312, as well as write data to disks 312. In some embodiments, head assembly 315 may include a preamplifier to provide preamplification of data read from disks 312.

In the embodiment of FIG. 3, SPM control module 303 includes a commutation module 320 to monitor the speed of spindle motor 311, a spindle driver 321 to drive the spindle motor 311, and a speed control module 322 to control the spindle driver based on the input provided by commutation module 320. SPM control module 303 is used to measure the disk speed and provides feedback to coarsely control the disk speed.

Likewise, position module 302 is used to control head actuator servo 313 to precisely place the heads 314 over a desired location on disks 312 to read or write data. The position module 302 includes a servo demodulator 330 to demodulate signals from read/write channel module 301 and the demodulated output from servo demodulator 330 is coupled to an analog-to-digital converter (ADC) 331. Demodulator 330 looks at the signal coming from the head and determines how far off the head is from being on the right track. ADC 331 converts the analog demodulated signal to a digital form for input to a servo processor 332. A second signal path from read/write channel module 301 is coupled to a servo peak detector 333, which identifies the 0's and 1's of the servo information, to determine where the head is over the disk. The output from peak detector 333 is then decoded by servo decoder 334 for input to processor 332. The demodulated and decoded information is processed by processor 332 and utilized to generate drive signals for voice coil motor (VCM) driver 336. A digital-to-analog converter (DAC) 335 is used to convert digital control signals from processor 332 into analog form. VCM driver 336 then uses the feedback loop to operate actuator servo 313 to correct the positioning of the head(s). A memory 337, shown as a ROM, is included to store instructions to operate processor 332.

Read/write channel module 301 includes a sampled detector 340 for sampling and detecting a read signal from assembly 315. The analog read data from the disk is coupled to detector 340, via head assembly 315, to be sampled and detected. The detected signal is coupled to encoder/decoder (ENDEC) module 341 to be decoded. Typically, detector 340 has an ADC to provide analog-to-digital conversion. ENDEC module 341 then decodes digital form of the sampled/detected read data and couples the read data to controller module 304. Outputs from detector 340 are also coupled to demodulator 330 and detector 333. During a write operation, ENDEC module 341 receives digital data from controller module 304 and encodes the data for writing to the disk through head assembly 315.

Read/write channel module 301 includes a clock generator 343 to provide a reference clock for generating other timing and/or clock signals for use by one or more components of disk controller 310. In other embodiments, the reference clock may be provided from a clock source external to disk controller 310, or even apparatus 300. A clock synchronizer module 342 receives the reference clock and generates clocking or timing signals for coupling to detector 340. In one embodiment, synchronizer 342 uses a phase-locked-loop (PLL) to synchronize the sampling timing of detector 340 when sampling data from disks 312.

ENDEC 341 is coupled to sequencer 351 of controller module 304 for transfer of data between read/write module 301 and controller module 304. Controller module 304 includes sequencer 351, data-path processor 352 and its memory (in way of a ROM) 355, buffer memory (shown as a RAM) 354, buffer control circuitry 353 and interface 356. As noted above, sequencer 351 provides for the transfer of data between modules 301, 304. Buffer 354, under control of buffer control circuitry 353, stores data that is to be written to the disk or was read from the disk. Interface 356 is used to interface disk controller 310 with host 212 via bus 340. As shown, bus 357 is used as an internal bus for data transfer among sequencer 351, buffer 345 and interface 356.

As noted in FIG. 3, a second bus 358 is used to couple control and data signals between various devices on controller module 304. Data-path processor 352 is coupled to bus 358 for transfer of control and/or data signals. ROM 355, also coupled to bus 358, is utilized to store instructions which operate on processor 352. It is to be noted that specific circuit nomenclature, such as RAM and ROM, are provided as examples only and various other memory devices (both internal or external to disk controller 310) may be utilized. Again, as noted above, although specific components are shown, they need not be limited to such components. Thus, shown processors may be microprocessors, processing modules, state machines, microcode, etc.

As earlier described in the Background section above, migration from one sector size (such as 512 byte sector size) to a larger sector size (such as 4K byte sector size), may not be possible with a legacy HDD if a disk controller for that HDD is not operable with the larger sector. However, if a disk controller is designed with the ability to migrate to the larger sector, then HDDs with this particular disk controller may operate in legacy mode, as well as with the larger sector size when the actual migration occurs.

Figure 4:
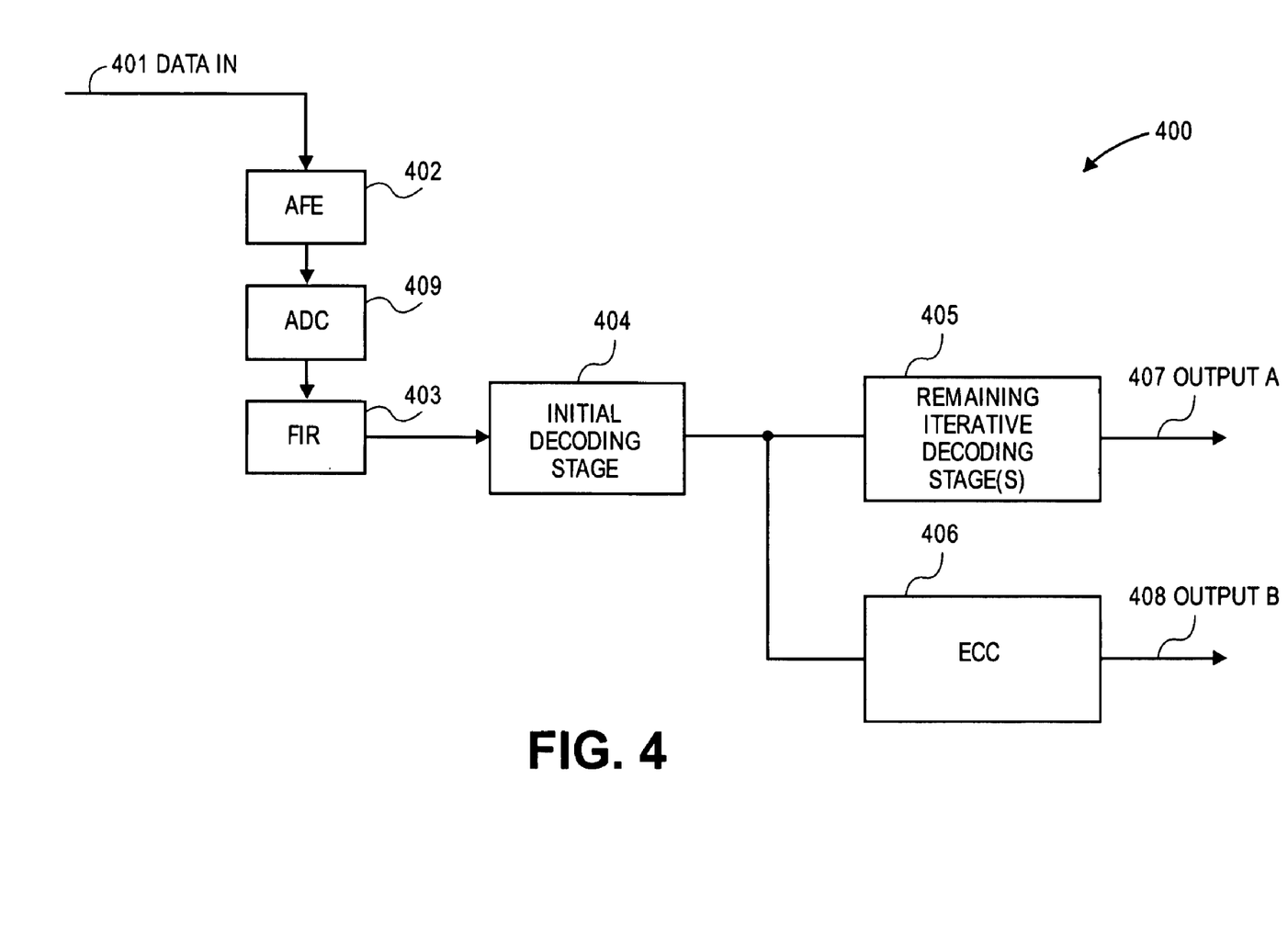
FIG. 4 shows a block diagram of an embodiment of a decoder that uses an iterative decoding scheme and an ECC scheme to allow a HDD to operate at two different sector sizes.

Accordingly, FIG. 4 shows one embodiment of the invention in which such a migration may occur. FIG. 4 shows an apparatus 400 that is used to receive data signals from a disk and decode the read data to generate a decoded output. Apparatus 400 includes an analog front end (AFE) 402, analog-to-digital converter (ADC) 409, finite impulse response (FIR) filter 403, initial decoding stage 404, remaining decoding stage(s) 405 and error correction code module 406.

When data is read from a disk, analog signals are picked up by the read head(s) and coupled to AFE 402 in way of DATA IN (read data) signals 401. AFE 402 provides signal shaping and the output from AFE 402 is coupled to ADC 409 for sampling to convert the analog form of the read data to digital form, before being coupled to FIR filter 403. FIR filter 403 provides equalization/adaptation and the filter output from FIR filter 403 is a channel-equalized signal that is ready to be decoded to determine the actual data value that is read from the disk. The decoding section is comprised of a first decoding stage, noted as initial decoding stage 404, and a second decoding stage, noted as remaining decoding stage 405. Although a single stage is referenced for decoding stage 405, it is to be noted that multiple stages may comprise remaining decoding stage 405.

Initial decoding stage 404, when combined with remaining decoding stage 405 form a decoder that is operable to perform as an iterative decoder to iteratively decode the read signal from FIR filter 403. A read data signal which is operated on by the combined decoding technique of stages 404 and 405 is output from stage 405 as output 407 (also noted as output A). Iterative decoding by stages 404, 405 is one technique for decoding data input 401 to generate data output 407.

Alternatively, initial decoding stage 404 may be combined with error correction code (ECC) module 406 to form a decoder that is operable to perform as a decoder with ECC to correct errors that may result from the decoding provided by stage 404. Thus, a read data signal which is operated on by the combined decoding of stage 404 and error correcting by ECC module 406 is output from ECC module 406 as output 408 (also noted as output B).

It is to be noted that two different decoding schemes are noted in apparatus 400. The first decoding scheme is strictly an iterative decoding scheme in which the iterative stages that perform the decoding are separated between a first iterative decoding stage, noted by initial decoding stage 404, and a second iterative decoding stage, noted by remaining iterative decoding stage 405. Output A exemplifies read data that has been decoded by two (or more) stages of iterative decoding.

The second decoding scheme is performed by initial decoding stage 404 and possible errors resulting from the decoding are corrected by ECC module 406. That is, apparatus 400 uses initial decoding stage 404 to perform the decoding and the output from stage 404 is coupled to ECC module 406 to perform the error correction. Output B exemplifies read data that has been decoded and errors corrected by ECC.

It is to be noted that decoding stage 404 performs a type of decoding that may suffice to produce a decoded value of the read data, if appropriate error correction is applied to correct for decoding errors to obtain a certain BER. In this instance, ECC module 406 is used to provide the error correction to obtain the correct recovery of the read data. Alternatively, the decoding performed by decoding stage 404 may also be applied to further decoding stages of an iterative decoding scheme, so that an accurate representation of the read data is obtained. Thus, it is to be noted that, most likely, initial decoding stage 404 alone does not provide decoding sufficient to meet a certain BER value. Either, further iterative decoding, by use of remaining iterative decoding stage 405, or error correction, by ECC module 406, is utilized to obtain an acceptable BER value from apparatus 400 in way of Output A or Output B.

A variety of decoding techniques may be selected to provide the initial decoding performed in decoding stage 404. This initial decoding is applicable as part of an iterative decoding scheme when in an iterative mode of decoding with stage 405 or as part of a non-iterative decoding scheme when in a non-iterative mode of decoding with ECC module 406. When in the non-iterative mode of decoding, the initial decoding performed by decoding stage 404 is to provide sufficient decoding so that error correction provided by ECC module 406 produces a correct recovery of the read data.

In one embodiment, a sequence detector is utilized for decoding in initial decoding stage 404. One type of sequence detector uses a Viterbi algorithm. However, the sequence detector may use other types of algorithms and is not limited to a Viterbi algorithm. In one embodiment, a soft-decision output from a soft-input soft-output (SISO) sequence detector provides soft outputs to ECC module 406. This soft output from SISO decoding is post processed by a processor and error corrected in ECC module 406. The soft output from the SISO sequence detector may be used to improve the performance of the ECC (see for example, Algebraic Soft-Decision Decoding of Reed-Solomon Codes; IEEE Transactions on Information Theory, Vol. 49, No. 11, November 2003; pp. 2809-2825).

One such applicable SISO sequence detection technique is described in an article titled "A Viterbi Algorithm with Soft-Decision Outputs and its Applications" by Hagenauer and Hoeher (IEEE publication CH2682-3/89/0000-1680; pp. 1680-1686; 1989). This described technique is also referred to as soft-output Viterbi algorithm (SOVA) and when utilized with ECC module 406, the sequence detector is utilized in a non-iterative decoding mode with the Viterbi algorithm.

Another sequence detector is described in an article titled "Optimal Decoding of Linear Codes for Minimizing Symbol Error Rate" by Bahl, Cocke, Jelinek and Raviv [BCJR] (IEEE Transactions of Information Theory; pp. 284-287; March 1974). Accordingly, in one embodiment, a BCJR output may be generated from decoding stage 404 for non-iterative decoding and further processed for error correction by ECC module 406. Alternatively, in another embodiment, a hard output from a sequence detector may be sent to ECC module 406 for error correction.

In reference to ECC module 406, a variety of ECC error correction technique may be performed. One commonly used ECC technique is Reed-Solomon ECC. Thus, SOVA or BCJR decoding may be combined with Reed-Solomon ECC to provide the decoding and ECC performed by decoding stage 404 and ECC module 406.

When the sequence detector is utilized in the iterative mode, both decoding stage 404 and 405 operate as iterative decoder stages. Iterative decoders have more than one instance of a decoding detector and these multiple detectors are used to obtain bit values. Either SOVA or BCJR may be combined with the remaining iterative decoding stage 405 to generate a decoded output. One embodiment for providing the iterative decoding within stage 405 uses low-density parity-check (LDPC) codes and is described in an article titled "Optimal Code Rates for the Lorentzian Channel: Shannon Codes and LDPC Codes" by William E. Ryan et al.; IEEE Transactions on Magnetics, Vol. 40, No. 6, November 2004; pp. 3559-3565. Thus, in one example, SOVA or BCJR may be combined with LDPC to provide the iterative decoding to decode the read data. It is to be appreciated that the various techniques noted above (e.g. SOVA, BCJR, LPDC and Reed-Solomon ECC) are examples only and that other algorithms and techniques may be readily implemented to perform equivalent operations.

In one application, apparatus 400 is implemented in either disk controller 210 of FIG. 2 or disk controller 310 of FIG. 3. With disk controller 210, decoding stages 404, 405 and ECC module 406 are typically implemented in processing module 207. With disk controller 310, decoding stages 404, 405 and ECC module 406 are implemented in sampled detector 340 and/or ENDEC 341. A mechanism, such as hardware selection through a pin, or program selection by software or register entry, is used to select whether the iterative mode or the non-iterative ECC mode is to be used when controlling a disk drive. The ability to select and use one technique or the other has a number of advantages.

One advantage of having both the iterative decoding scheme and the non-iterative decoding with ECC scheme, allows a gradual shift from one HDD sector size to another. In the example noted earlier, 512 byte sector size HDDs may migrate to 4K byte sector size HDDs. The legacy 512 byte sector size would rely on the use of iterative decoding, while the new 4K byte sector size would rely on the use of ECC. Iterative decoding of LDPC for 512 byte sectors generally provide 1 dB of signal-to-noise ratio (SNR) gain and achieves sector failure rate of approximately less than $10^{-7}$. However, LDPC may not be adequate to provide acceptable performance at the larger sector size of 4K bytes. This is because iterative decoding is memory intensive and a 4K byte solution would be high-power and have a large die size on a chip. Accordingly, for 4K byte sectors, non-iterative decoding is utilized with either 10-bit or 12-bit Reed-Solomon ECC to obtain approximately 1 dB SNR gain. ECC scales with much more efficiency at the larger sector sizes than iterative decoding.

Accordingly, in one embodiment of implementing the two decoding schemes, iterative decoding is used for decoding data on 512 byte sector size and non-iterative decoding with ECC is used for decoding data on larger sectors, such as the 4K byte sector size. As an added benefit, 512 byte sector size disks may use non-iterative decoding and ECC as a redundancy or back-up system, in the event stage 405 is non-functional. Thus, effective migration from 512 byte sector size HDDs to larger sector size HDDs may be obtained without replacing the disk controller (e.g. disk controller integrated circuit).

Figure 5:
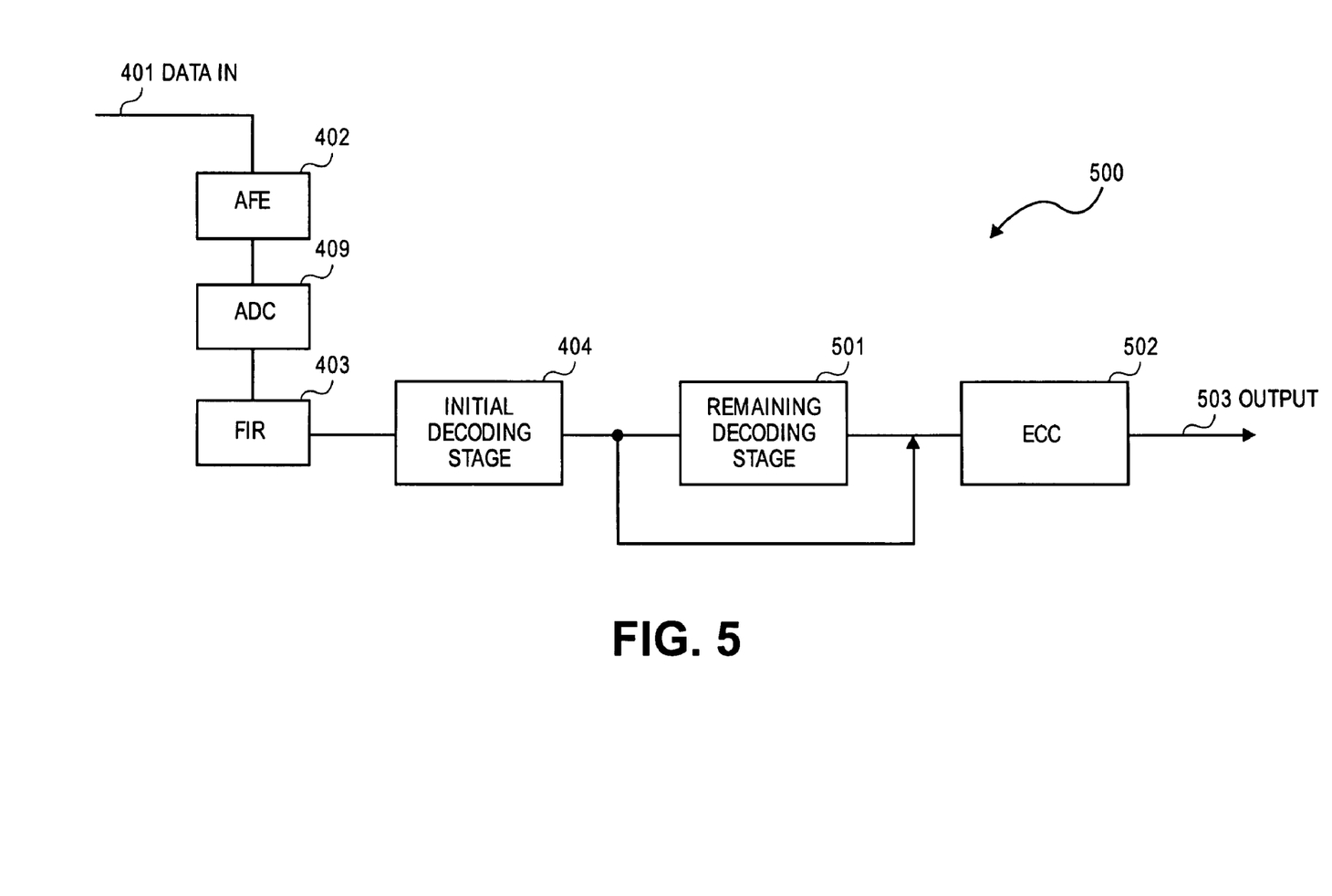
FIG. 5 shows a block diagram of another embodiment of a decoder that uses an iterative decoding scheme and an ECC scheme to allow a HDD to operate at two different sector sizes.

FIG. 5 shows another embodiment of the invention in which apparatus 500 employs same units 402, 409, 403 and 404 of FIG. 4 in a similar arrangement. However, the remaining decoding stage and ECC modules are reconfigured differently. In apparatus 500, decoding stage 501 (equivalent to stage 405) and ECC module 502 (equivalent to ECC module 406) are configured in tandem. When in the non-iterative decoding mode, the output of initial decoding stage 404 is coupled to ECC module 502, which configuration is similar to that shown in FIG. 4. However, in the iterative mode, the iterative decoded output from stage 502 is coupled to ECC module 502 so that ECC operation is performed. Accordingly, in one embodiment, SOVA/BCJR is combined with LDPC and subsequently operated on by Reed-Solomon ECC in the iterative mode and only SOVA/BCJR is operated by ECC in the non-iterative mode. It is appreciated that various other combinations may be implemented in other embodiments.

Thus, use of ECC with iterative decoding for iterative and non-iterative decoding in a read channel for a disk drive is described.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more of its corresponding functions and may further include inferred coupling to one or more other items.

Furthermore, the term "module" is used herein to describe a functional block and may represent hardware, software, firmware, etc., without limitation to its structure. A "module" may be a circuit, integrated circuit chip or chips, assembly or other component configurations. Accordingly, a "processing module" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions and such processing device may have accompanying memory. A "module" may also be software or software operating in conjunction with hardware.

Additionally, the various components noted in the description above, may be implemented separately or integrated onto an integrated circuit (IC) chip, including being integrated as a system on a chip (SoC).

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. Similarly, flow diagram blocks and methods of practicing the embodiments of the invention may also have been arbitrarily defined herein to illustrate certain significant functionality. To the extent used, the flow diagram block boundaries and methods could have been defined otherwise and still perform the certain significant functionality. Such alternate definitions of functional building blocks, flow diagram blocks and methods are thus within the scope and spirit of the claimed embodiments of the invention. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

We claim:

1. An apparatus comprising:
a first decoder to perform first decoding by sequence detection of a signal read from a disk and to generate a first decoded output;
a second decoder coupled to receive the first decoded output from the first decoder and to perform second decoding to the first decoded output to generate a first data output, in which combined operations of the first decoding and the second decoding perform iterative decoding of the signal read from the disk to recover data stored on the disk when the disk has a first sector size format; and
an error correction code module coupled to receive the first decoded output from the first decoder and to apply error correction code (ECC) to the first decoded output to generate a second data output, in which combined operations of the first decoding and the ECC perform non-iterative decoding of the signal read from the disk to recover data stored on the disk when the disk has a second sector size format.

2. The apparatus of claim 1, wherein the first sector size format is a 512 byte sector format.

3. The apparatus of claim 1, wherein the first decoder is a sequence detector and the second decoder is a low-density parity-check (LDPC) decoder.

4. The apparatus of claim 2, wherein the first decoder is a SOVA or BCJR decoder and the second decoder is a low-density parity-check (LDPC) decoder for recovering data from a 512 byte sector size formatted disk.

5. The apparatus of claim 1, wherein the first decoder is a sequence detector and the error correction code module uses Reed-Solomon error correction.

6. The apparatus of claim 1, wherein the first decoder is a SOVA or BCJR decoder and the error correction code module uses Reed-Solomon error correction to recover data from a 4K byte sector formatted disk, in which the second sector size format is a 4K byte sector size format.

7. An apparatus comprising:
a first decoder to perform first decoding by sequence detection of a signal read from a disk and to generate a first decoded output;
a second decoder coupled to receive the first decoded output from the first decoder and to perform second decoding to the first decoded output, in which combined operations of the first decoding and the second decoding perform iterative decoding of the signal read from the disk to recover data stored on the disk; and
an error correction code module coupled to receive the first decoded output from the first decoder and to apply error correction code (ECC) to the first decoded output to generate a first data output, in which combined operations of the first decoding and the ECC perform non-iterative decoding of the signal read from the disk to recover data stored on the disk when in a first mode of operation the disk has a first sector size format, and the error correction module coupled to receive an iterative output from the second decoder and to apply ECC to the iterative output of the second decoder to output a ECC corrected iterative output as a second data output when the disk has a second sector size format.

8. The apparatus of claim 7, wherein the first and second decoders are utilized to perform iterative decoding to obtain data recovery from a 512 byte sector size formatted disk.

9. The apparatus of claim 7, wherein the first decoder is a sequence detector and the second decoder is a low-density parity-check (LDPC) decoder.

10. The apparatus of claim 8, wherein the first decoder is a SOVA or BCJR decoder and the second decoder is a low-density parity-check (LDPC) decoder for recovering data from the 512 byte sector size formatted disk.

11. The apparatus of claim 7, wherein the first decoder is a sequence detector and the error correction code module uses Reed-Solomon error correction.

12. The apparatus of claim 7, wherein the first decoder is a SOVA or BCJR decoder and the error correction code module uses Reed-Solomon error correction to recover data from a 4K byte sector size formatted disk.

13. A method comprising:
decoding a signal read from a disk by performing sequence detection to generate a detected output from a first decoder;
decoding the detected output from the first decoder in a second decoder to generate a first data output, in which combined operations of the sequence detection and the decoding of the detected output perform iterative decoding of the signal read from the disk to recover data stored on the disk when the disk has a first sector size format; and
applying an error correction code (ECC) to the detected output from the first decoder to generate a second data output, in which combined operations of the sequence detection and the ECC perform non-iterative decoding of the signal read from the disk to recover data stored on the disk when the disk has a second sector size format.

14. The method of claim 13, wherein the decoding by performing sequence detection uses a sequence detector in the first decoder.

15. The method of claim 13, wherein the decoding by performing sequence detection uses a SOVA or BCJR decoder and decoding in the second decoder uses a low-density parity-check (LDPC) decoder to recover data from a 512 byte sector size formatted disk.

16. The method of claim 14, wherein applying the ECC applies the ECC using Reed-Solomon ECC.

17. The method of claim 15 wherein applying the ECC applies the ECC using Reed-Solomon ECC to recover data from a 4K byte sector size formatted disk.

18. A method comprising:
decoding a signal read from a disk by performing sequence detection to generate a detected output from a first decoder;
decoding the detected output from the first decoder in a second decoder, in which combined operations of the sequence detection and the decoding of the detected output perform iterative decoding of the signal read from the disk;

applying an error correction code (ECC) to the detected output from the first decoder to generate a first data output, in which combined operations of the sequence detection and the ECC perform non-iterative decoding of the signal read from the disk to recover data stored on the disk when the disk has a first sector size format; and applying the ECC to an iterative output from the second decoder to output a ECC corrected iterative output to recover data stored on the disk when the disk has a second sector size format.

19. The method of claim 18 wherein the iterative mode of operation is used to recover data from a 512 byte sector size formatted disk and the non-iterative mode of operation is used to recover data from a 4K byte sector size formatted disk.

20. The method of claim 19 wherein the decoding by performing sequence detection uses a SOVA or BCJR decoder and Reed-Solomon ECC is used for applying the ECC.

* * * * *

UNITED STATES PATENT AND TRADEMARK OFFICE
CERTIFICATE OF CORRECTION

PATENT NO. : 8,069,397 B2
APPLICATION NO. : 11/643067
DATED : November 29, 2011
INVENTOR(S) : Andrei E. Vityaev et al.

It is certified that error appears in the above-identified patent and that said Letters Patent is hereby corrected as shown below:

Col. 11, line 64, in claim 7: after "disk" delete "to recover data stored on the disk"
Col. 12, lines 4-5, in claim 7: after "stored on the disk when" delete "in a first mode of operation"

Signed and Sealed this
Fifteenth Day of January, 2013

David J. Kappos
*Director of the United States Patent and Trademark Office*